(12) United States Patent
Lin

(10) Patent No.: US 10,097,147 B2
(45) Date of Patent: Oct. 9, 2018

(54) CIRCUIT FOR AUTOMATICALLY MEASURING GAIN OF BUILT-IN TRANS-IMPEDANCE AMPLIFIER

(71) Applicant: Xiamen UX High-Speed IC Co., Ltd., Xiamen (CN)

(72) Inventor: Shaoheng Lin, Xiamen (CN)

(73) Assignee: XIAMEN UX HIGH-SPEED IC CO., LTD., Xiamen, Fujian (CN)

( * ) Notice: Subject to any disclaimer, the term of this patent is extended or adjusted under 35 U.S.C. 154(b) by 0 days.

(21) Appl. No.: 15/703,990

(22) Filed: Sep. 14, 2017

(65) Prior Publication Data

US 2018/0262171 A1    Sep. 13, 2018

(30) Foreign Application Priority Data

Mar. 10, 2017    (CN) .......................... 2017 1 0141033

(51) Int. Cl.
*H03F 3/08* (2006.01)
*H03F 3/45* (2006.01)
*G01R 19/00* (2006.01)
*G01R 27/02* (2006.01)

(52) U.S. Cl.
CPC ..... *H03F 3/45475* (2013.01); *G01R 19/0023* (2013.01); *G01R 27/02* (2013.01)

(58) Field of Classification Search
CPC ....................................................... H03F 3/08

USPC ...................................... 330/308; 250/214 A
See application file for complete search history.

(56) References Cited

U.S. PATENT DOCUMENTS

| | | | | |
|---|---|---|---|---|
| 5,781,233 A * | 7/1998 | Liang | ............... | H01L 27/14609 257/233 |
| 6,112,119 A * | 8/2000 | Schuelke | ............. | A61N 1/3704 607/9 |
| 7,489,186 B2 * | 2/2009 | Segarra | .................. | G01R 19/32 330/2 |
| 2009/0243566 A1 * | 10/2009 | Trattler | ................. | H02M 3/156 323/265 |
| 2010/0225634 A1 * | 9/2010 | Levey | .................. | G09G 3/3208 345/212 |
| 2016/0380595 A1 * | 12/2016 | Finlinson | .............. | H03F 1/0227 600/479 |

* cited by examiner

*Primary Examiner* — Henry Choe
(74) *Attorney, Agent, or Firm* — Leong C. Lei

(57) ABSTRACT

A circuit for automatically measuring gain of a built-in trans-impedance amplifier includes a current source built in a trans-impedance amplifier chip for generating a constant current to an input end of the trans-impedance amplifier. The circuit samples a voltage amplitude at an output end of the trans-impedance amplifier using a voltage amplitude sampling device, and calculates the gain of the trans-impedance amplifier. The current source has a constant reference voltage source, a reference current generator, a clock source, an AC switch, and an off-chip precision resistor. The circuit is configured to measure gain of trans-impedance amplifiers directly.

4 Claims, 1 Drawing Sheet

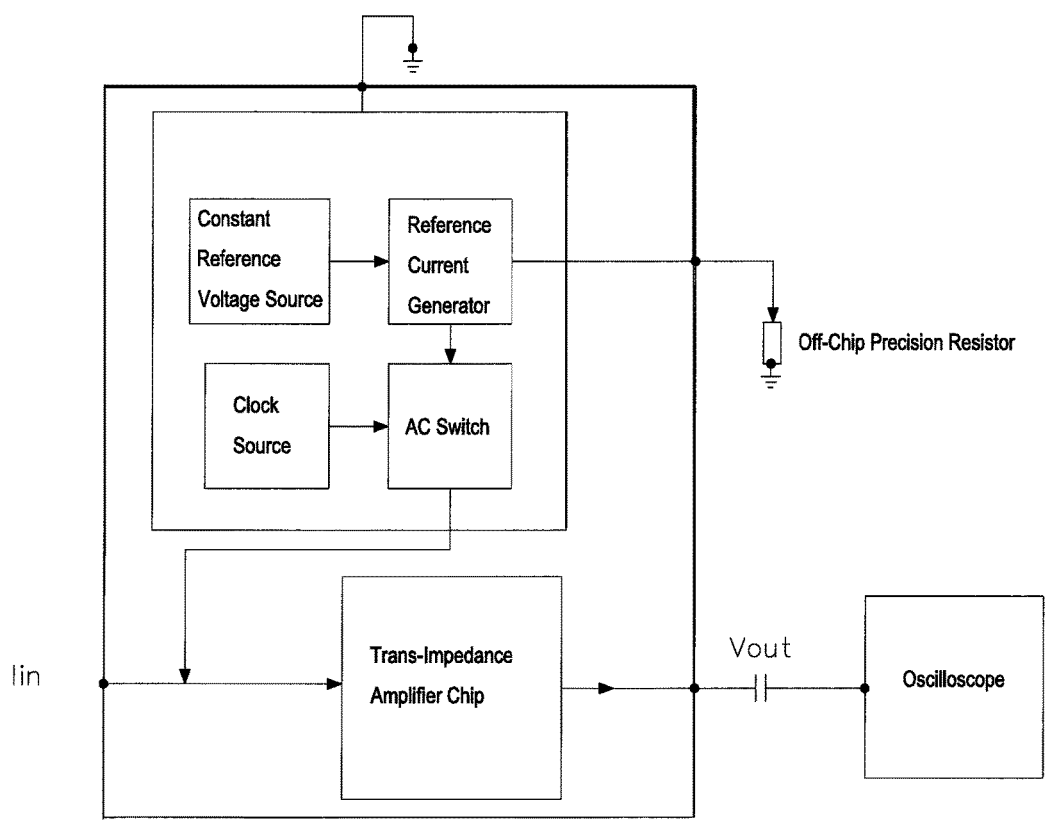

CIRCUIT FOR AUTOMATICALLY MEASURING GAIN OF BUILT-IN TRANS-IMPEDANCE AMPLIFIER

BACKGROUND OF THE INVENTION

1. Technical Field

The present invention relates to trans-impedance amplifiers, and more particularly to a circuit for automatically measuring gain of a trans-impedance amplifier.

2. Description of Related Art

A trans-impedance amplifier (TIA) is an electronic amplifier circuit converting and amplifying an input current signal into a voltage signal, and has been mainly used to realize photoelectric transformation. For example, in a front end receiver circuit for modern high-speed optical communication, a TIA is the most critical receiver component.

Commercially, in batch production of trans-impedance amplifier IC (Integrated Circuit) products, testing and screening have to be conducted before the produced IC products leave the factory and any non-conforming or defective items should be removed in order to ensure good quality and consistent performance and parameters. Opposite to lab testing, such batch testing needs to be simple, low-cost, efficient, automated, yet reliable. For commercial high-speed trans-impedance amplifier products, the parameter trans-impedance is an indicator of great importance. Thus, in batch protection, automated testing is the essential final step to ensure high consistency and low deviation of products. This indicator when tested in a laboratory is conducted by packaging a TIA to be tested and a photodiode (PD) into a ROSA and submitting the ROSA to a network analyzer with optical interface output for accurate measurement. However, this known approach is not suitable to fast automated testing that is required by batch production for the following reasons:

1. Screening is conducted before TIAs leave the factory and at this point TIAs have not been packaged with PDs yet;
2. High-speed network analyzers with optical interface are very expensive, say fifteen million dollars or higher, making the overall testing costly; and
3. Network analyzers work on complicated testing schemes, and are no simple and efficient enough.

Hence, due to the foregoing problems, there is a pressing need for a testing approach to TIA products in the production context that is simple and effective and needs no expensive peripheral equipment.

SUMMARY OF THE INVENTION

The present invention herein provides a circuit for automatically and directly measuring gain of trans-impedance amplifiers. The circuit is more reliable and more stable yet less expensive as compared to the prior art.

For solving the foregoing technical problems, the present invention provides a circuit for automatically measuring gain of a built-in trans-impedance amplifier, comprising a current source that is built in a trans-impedance amplifier chip for generating a stable, constant current to an input end of the trans-impedance amplifier; the circuit sampling a voltage amplitude at an output end of the trans-impedance amplifier using a voltage amplitude sampling device and calculating the gain of the trans-impedance amplifier; the current source comprising a constant reference voltage source, a reference current generator, a clock source, an AC switch and an off-chip precision resistor; the clock source opening or closing the AC switch, thereby disconnecting or connecting an output end of the reference current generator from or to the input end of the trans-impedance amplifier; and the off-chip precision resistor being connected to the reference current generator for modulating a current output by the reference current generator.

In a preferred embodiment, the AC switch is a lead of the trans-impedance amplifier chip, in which when the lead is grounded, the current source is in an enabled state, and when the lead is floating, the current source is in a disabled state.

In a preferred embodiment, the voltage amplitude sampling device is an oscilloscope.

In a preferred embodiment, the gain of the trans-impedance amplifier is $Zt = Vout/Iin$, where $Iin$ is an input current at the input end of the trans-impedance amplifier, and $Vout$ is an output voltage at the output end of the trans-impedance amplifier.

Hence, the present invention provides the following beneficial effects over the prior art:

1. The disclosed circuit for automatically measuring gain has the current source generating the input current built in a trans-impedance amplifier chip, making it possible to perform measurement without using expensive external, complicated equipment.
2. Commercial trans-impedance amplifiers always incorporate automatic gain control AGC, when the input current is large, trans-impedance decreases automatically. For this reason, in order to test the actual trans-impedance of a TIA, the input current must be very small (μA level), and thus the input AC voltage signal source device has to output a voltage signal small enough. This in turn brings challenges to the output signal magnitude in terms of precision and stability, or requires a large series resistance that makes change to the TIA's equivalent trans-impedance and bandwidth properties.
   The disclosed circuit for automatically measuring gain eliminates the need of additionally connecting series resistors at the input end of the trans-impedance amplifier by using the built-in current source to directly input high-precision current to the input end of the trans-impedance amplifier, and ensures that the measured value reflects the real gain because the trans-impedance amplifier is allowed to work as normal without change.
3. The disclosed circuit for automatically measuring gain has its built-in current source much more reliable and more stable than peripheral circuits and equipment. In addition, since the resistor for determining the output current is arranged externally, the impact of intermittent manufacturing of wafers on testing accuracy can be minimized.

BRIEF DESCRIPTION OF THE DRAWINGS

FIG. 1 is a block diagram of a circuit according to one preferred embodiment of the present invention.

DETAILED DESCRIPTION OF THE INVENTION

The invention as well as a preferred mode of use, further objectives and advantages thereof will be described below.

Referring to FIG. 1, the present invention provides a circuit for automatically measuring gain of a built-in trans-impedance amplifier. It comprises a current source that is built in a trans-impedance amplifier chip.

The current source comprises a constant reference voltage source, a reference current generator, a clock source, an AC switch, and an off-chip precision resistor. The clock source opens or closes the AC switch, thereby disconnecting or connecting an output end of the reference current generator from or to the input end of the trans-impedance amplifier. The off-chip precision resistor is connected to the reference current generator for modulating a current output by the reference current generator.

With the foregoing configuration, the reference current generator can generate a stable, constant current to the input end of the trans-impedance amplifier. A voltage amplitude sampling device is used to sample the voltage amplitude at the output end of the trans-impedance amplifier for subsequent calculation of the gain of the trans-impedance amplifier. The trans-impedance amplifier's gain is $Zt=Vout/Iin$, where Iin is the input current at the input end of the trans-impedance amplifier, and Vout is the output voltage at the output end of the trans-impedance amplifier.

Since the current source for generating the input current is built in the trans-impedance amplifier chip, there is no need to use expensive external, complicated equipment, allowing the disclosed circuit to be provided with low costs.

In addition, commercial trans-impedance amplifiers always incorporate automatic gain control AGC, when the input current is large, trans-impedance decreases automatically. For this reason, in order to test the actual trans-impedance of a TIA, the input current must be very small (μA level), and thus the input AC voltage signal source device has to output a voltage signal small enough. This in turn brings challenges to the output signal magnitude in terms of precision and stability, or requires a large series resistance that makes change to the TIAs equivalent trans-impedance and bandwidth properties.

As a solution to this issue, the disclosed circuit eliminates the need of additionally connecting series resistors at the input end of the trans-impedance amplifier by using the built-in current source to directly input high-precision current to the input end of the trans-impedance amplifier, and ensures that the measured value reflects the real gain because the trans-impedance amplifier is allowed to work as normal without change.

Since the resistor for determining the output current is arranged externally, the impact of intermittent manufacturing of wafers on testing accuracy can be minimized.

In the present embodiment, the AC switch is one lead of the trans-impedance amplifier chip. When the lead is grounded, the current source is in its enabled state. When the lead is floating, the current source is in its disabled state. Alternatively, the AC switch may be multiplex with other leads, and since this is a simple substitution of the present embodiment, no detailed description is provided herein for simplicity.

While the voltage amplitude sampling device as shown in an oscilloscope, it may be a different voltage amplitude sampling device provided that it can measure the voltage at the output end of the trans-impedance amplifier accurately.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A circuit for automatically measuring gain of a built-in trans-impedance amplifier, comprising a current source that is built in a trans-impedance amplifier chip for generating a stable, constant current to an input end of the trans-impedance amplifier; the circuit sampling a voltage amplitude at an output end of the trans-impedance amplifier using a voltage amplitude sampling device and calculating the gain of the trans-impedance amplifier; the current source comprising a constant reference voltage source, a reference current generator, a clock source, an AC switch and an off-chip precision resistor; the clock source opening or closing the AC switch, thereby disconnecting or connecting an output end of the reference current generator from or to the input end of the trans-impedance amplifier; and the off-chip precision resistor being connected to the reference current generator for modulating a current output by the reference current generator.

2. The circuit of claim 1, wherein the AC switch is a lead of the trans-impedance amplifier chip, in which when the lead is grounded, the current source is in an enabled state, and when the lead is floating, the current source is in a disabled state.

3. The circuit of claim 1, wherein the voltage amplitude sampling device is an oscilloscope.

4. The circuit of claim 1, wherein the gain of the trans-impedance amplifier is $Zt=Vout/Iin$, where Iin is an input current at the input end of the trans-impedance amplifier, and Vout is an output voltage at the output end of the trans-impedance amplifier.

* * * * *